(12) United States Patent
Chakrapani et al.

(10) Patent No.: US 7,759,780 B2
(45) Date of Patent: Jul. 20, 2010

(54) MICROELECTRONIC PACKAGE WITH WEAR RESISTANT COATING

(75) Inventors: Nirupama Chakrapani, Gilbert, AZ (US); Vijay S Wakharkar, Paradise Valley, AZ (US); Janet Feng, Chandler, AZ (US); Nisha Ananthakrishnan, Chandler, AZ (US); Shankar Ganapathysubramanian, Phoenix, AZ (US); Gregory S Constable, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/242,398

(22) Filed: Sep. 30, 2008

(65) Prior Publication Data

US 2010/0078806 A1   Apr. 1, 2010

(51) Int. Cl.
*H01L 23/29* (2006.01)

(52) U.S. Cl. .................................... 257/678; 257/787
(58) Field of Classification Search ................ 257/787, 257/678, 798; 385/147; 438/97
See application file for complete search history.

(56) References Cited

U.S. PATENT DOCUMENTS

| 7,312,104 | B2 * | 12/2007 | Noro | 438/108 |
| 7,327,039 | B2 * | 2/2008 | Charles et al. | 257/778 |
| 7,368,824 | B2 * | 5/2008 | Hosseini et al. | 257/779 |
| 7,470,473 | B2 * | 12/2008 | Eisler et al. | 428/701 |
| 7,547,645 | B2 * | 6/2009 | Bauer et al. | 438/758 |
| 2007/0102833 | A1 * | 5/2007 | Hack et al. | 257/789 |

* cited by examiner

*Primary Examiner*—Roy K Potter
(74) *Attorney, Agent, or Firm*—John N. Greaves

(57) ABSTRACT

A microelectronic package is provided. The microelectronic package includes a semiconductor substrate and a die having a top surface and a bottom surface, wherein the bottom surface of the die is coupled to the semiconductor substrate. The microelectronic package also includes a nanomaterial layer disposed on the top surface of the die.

17 Claims, 6 Drawing Sheets

MICROELECTRONIC PACKAGE WITH WEAR RESISTANT COATING

BACKGROUND

Microelectronic components for several mobile computing products as well as server and desktop products are manufactured as bare die microelectronic packages. Such packages include a die without an integrated heat spreader coupled to the die. One challenge of manufacturing such packages is wear and abrasion of an exposed surface of the die during assembly and test operations. Such wear and abrasion may damage the exposed surface of the die and may cause die cracking. The damage may occur due to mishandling of the package in high volume assembly as well during the use of the microelectronic package.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a method of shielding an exposed surface of a die from handling and test related damages. In particular, the technique uses a scratch and abrasion resistant nanomaterial coating disposed on the exposed surface of the die.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Figure 1:
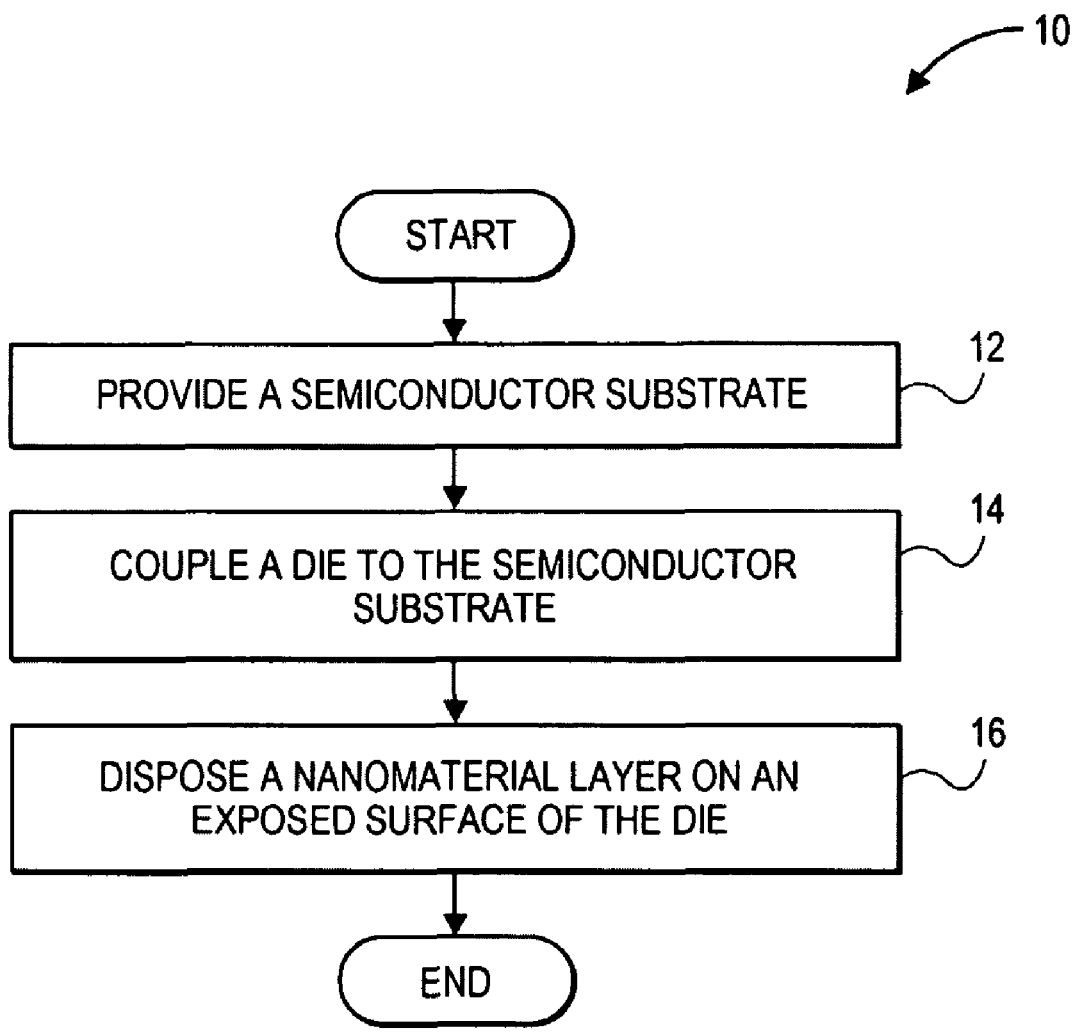
FIG. 1 illustrates an exemplary process for forming a microelectronic package in accordance with embodiments of present technique.

Referring first to FIG. 1, an exemplary process 10 for forming a microelectronic package is illustrated. At block 12, a semiconductor substrate is provided. The semiconductor substrate may be formed of a variety of materials including ceramic and printed circuit boards. Further, the semiconductor substrate may be a one-layer board or a multi-layer board. At block 14, a die is coupled to the semiconductor substrate. In certain embodiments, the die forms one of a data storage device, a digital signal processor, a micro-controller and a hand-held device. In this exemplary embodiment, the die is attached to a top surface of the semiconductor substrate and the attachment may be through a plurality of solder balls or solder bump connections, among other attachment methods.

At block 16, a nanomaterial layer is disposed on an exposed surface of the die. In this exemplary embodiment, the nanomaterial layer is to enhance a scratch and wear resistance of the exposed surface of the die. The nanomaterial layer substantially prevents handling related damages to the die during assembly and use of the microelectronic package. In one exemplary embodiment, the nanomaterial layer is applied to the exposed surface using spin coating. In another exemplary embodiment, the nanomaterial layer is applied to the exposed surface using spray coating.

In one exemplary embodiment, the nanomaterial layer includes a nanofiller disposed within a thermoplastic and thermosetting resin. In one exemplary embodiment, the resin includes epoxy. Other examples of the resin include, but are not limited to, acrylate, polycarbonate, polyimide and polyolefins. Examples of nanofiller include, but are not limited to, graphite, or carbon nanotubes, or carbon nanofibers, or boron nitride nanotubes, or alumina, or silica, or titania, or zirconia, or aluminum nitride, or diamond or combinations thereof.

In certain embodiments, a composition of the nanomaterial layer is selected to facilitate heat dissipation from the die to a surrounding environment. In this exemplary embodiment, conductive nanofillers such as carbon nanotubes, boron nitride nanotubes and alumina may be employed in the nanomaterial layer to facilitate the heat dissipation. Furthermore, the composition of the nanomaterial layer may be selected to facilitate a transparent appearance of the nanomaterial layer.

In the embodiment described above, the nanomaterial layer is disposed on the exposed surface of the die after coupling the die to the semiconductor substrate. In certain embodiments, the nanomaterial layer may be disposed on the exposed surface of the die prior to coupling of the die to the semiconductor substrate.

Figure 2:
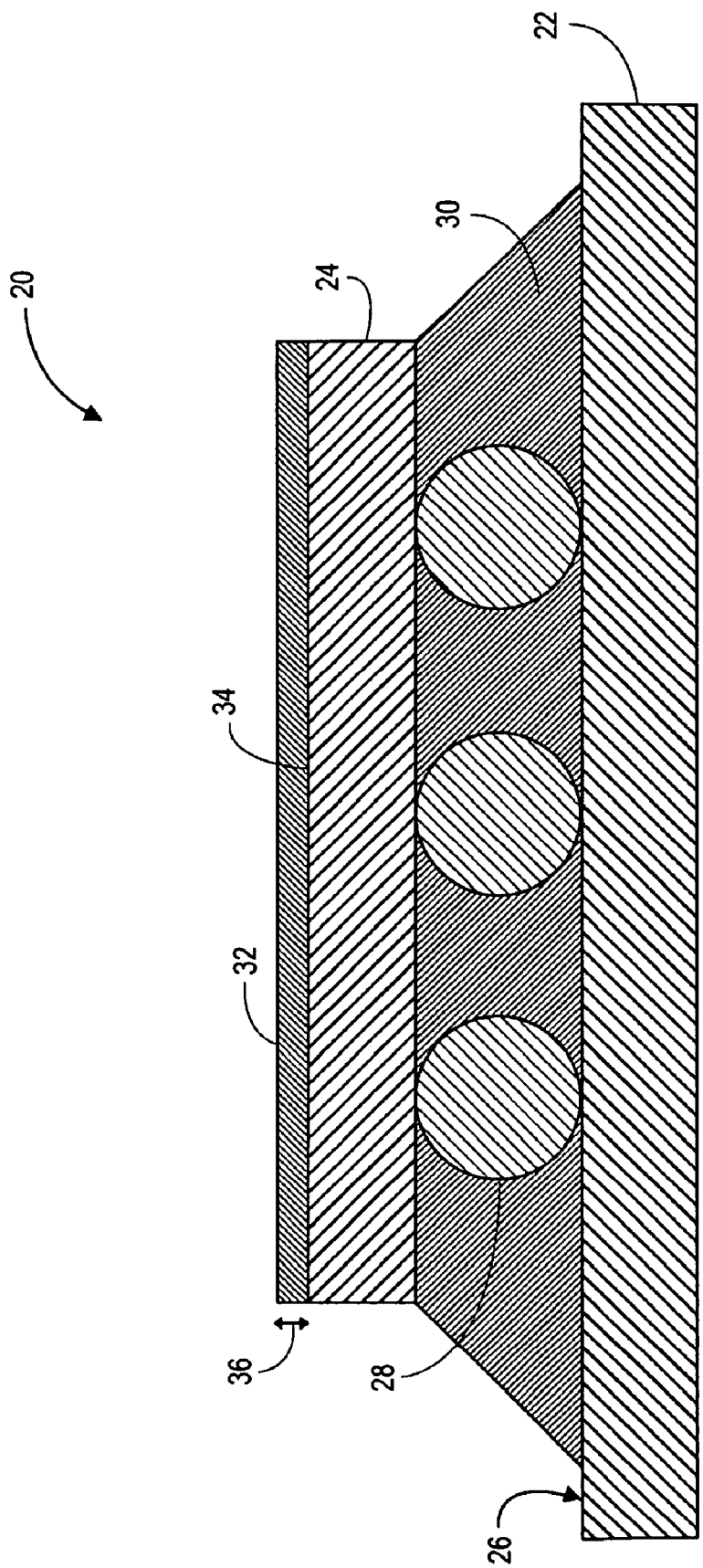
FIG. 2 illustrates an exemplary configuration of a microelectronic package in accordance with embodiments of present technique.

FIG. 2 illustrates an exemplary configuration of a microelectronic package 20. In the illustrated embodiment, the microelectronic package 20 includes a semiconductor substrate 22 and a die 24 coupled to a top surface 26 of the semiconductor substrate 22. In this exemplary embodiment, the die 24 is coupled to the semiconductor substrate 22 through a plurality of solder balls 28. However, other attachments techniques may be employed. Further, the microelectronic package 20 includes an underfill material 30 disposed between the die 24 and the semiconductor substrate 22.

The microelectronic package 20 also includes a nanomaterial layer 32 disposed on a top surface 34 of the die 24. In this embodiment, the top surface 34 is an exposed surface of the die 24. The nanomaterial layer 32 is to protect the surface 34 from test and assembly related damages that may lead to cracking of the die 24. In this exemplary embodiment, the nanomaterial layer 32 comprises a scratch and wear resistant material. In certain embodiments, a composition of the nanomaterial layer 32 may be customized to achieve a desired wear resistance.

In certain other embodiments, the composition of the nanomaterial layer 32 may be customized to enhance a thermal conductivity of the nanomaterial layer 32 thereby facilitating heat dissipation from the die 24. In certain other embodiments, the composition of the nanomaterial layer 32 may be customized to facilitate a transparent appearance of the nanomaterial layer 32 thereby maintaining a desired cosmetic appearance of the die 24.

In the illustrated embodiment, the nanomaterial layer 32 includes a resin having a nanofiller disposed within the resin. In one exemplary embodiment, a thickness 36 of the nanomaterial layer 32 is between about 1 micron to about 50 microns. In one embodiment, the thickness 36 of the nanomaterial layer 32 is about 20 microns. In one exemplary embodiment, the resin comprises epoxy. Other examples of the resin include, but are not limited to, acrylate, polycarbonate, polyimide and polyolefins. Examples of nanofiller disposed within the resin include, but are not limited to, carbon, graphite, carbon nanotubes, carbon nanofibers, boron nitride nanotubes, alumina, silica, titania, aluminum nitride, diamond and zirconia. In one exemplary embodiment, a weight percentage of the nanofiller disposed within the resin is between about 1% to about 60%. In certain embodiments, a shape of the nanofiller is sphere, or a rod, or a tube, or a platelet, or combinations thereof.

Figure 3:
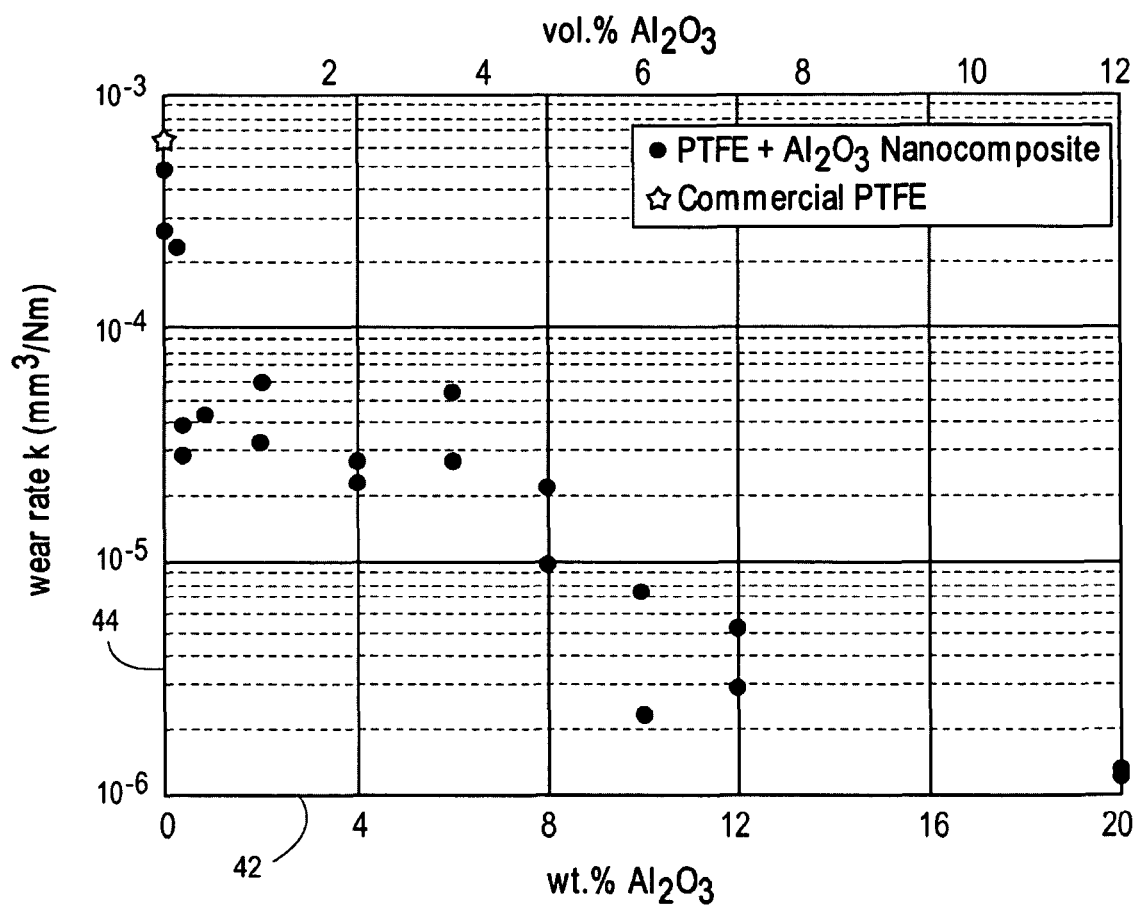
FIG. 3 illustrates exemplary results for wear rate for different weight percentages of a nanofiller in accordance with embodiments of present technique.

As described before, a composition of the nanomaterial layer 32 may be customized to achieve a desired wear resistance of the nanomaterial layer 32. In one exemplary embodiment, a weight percentage of the nanofiller is adjusted to achieve the desired wear resistance. FIG. 3 illustrates exemplary results 40 for wear rate (measured in $mm^3/Nm$) for different weight percentages of a nanofiller. In this exemplary embodiment, the abscissa axis represents weight percentage 42 of nanoalumina filler and the ordinate axis represents calculated wear rate 44. As can be seen, the reduction in wear rate 44 is observed even at low nanofiller weight percentages of between 1% to about 5%. Furthermore, a reduction of wear rate of about 600% is estimated for a weight % of about 20% of the nanoalumina filler.

Figure 4:
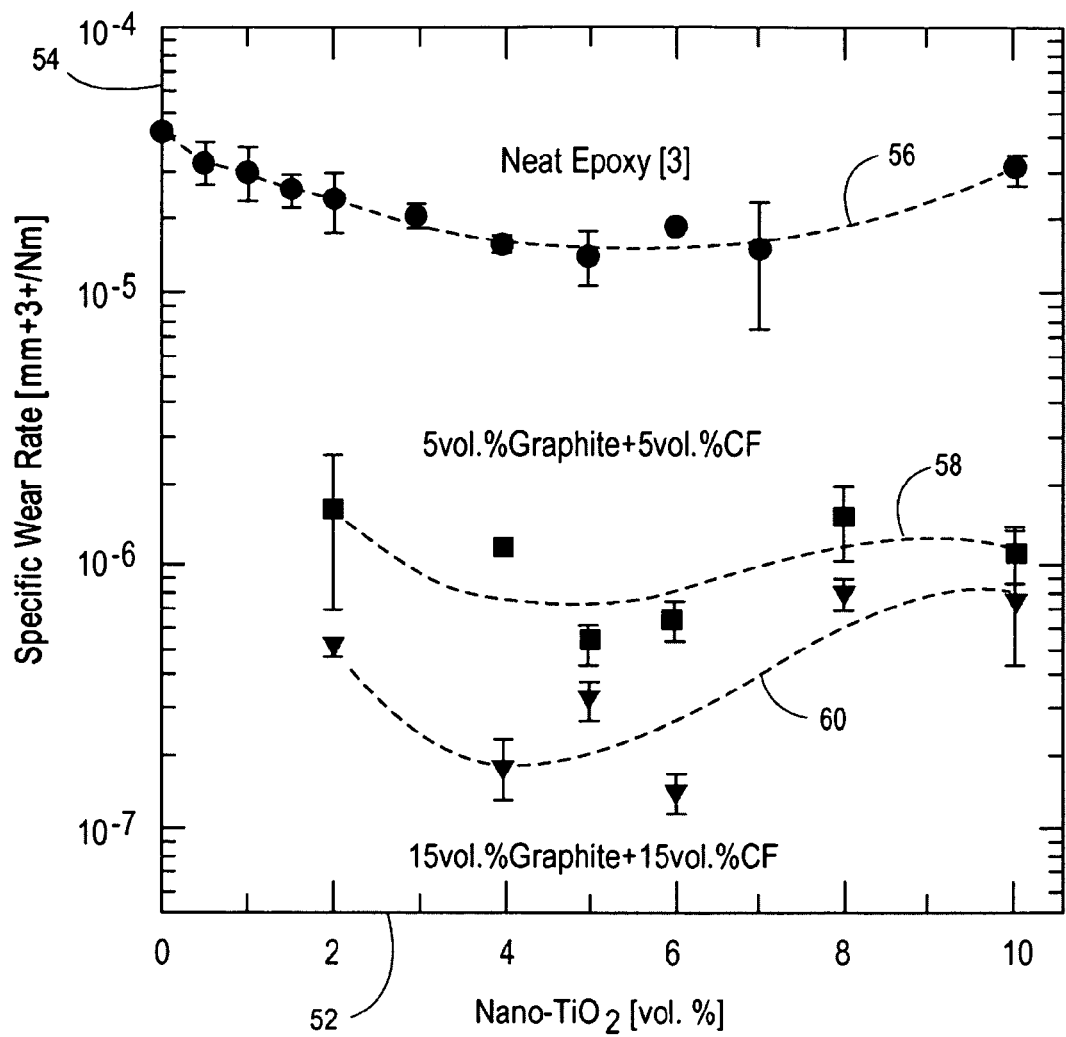
FIG. 4 illustrates exemplary results for specific wear rate for a thermosetting resin such as epoxy having thermally conductive filler with nanotitania particles in accordance with embodiments of present technique.

FIG. 4 illustrates exemplary results 50 for specific wear rate for a thermosetting resin such as epoxy having thermally conductive filler with nanotitania particles. In this exemplary embodiment, the abscissa axis represents volume percentage 52 of nanotitania filler incorporated with a thermally conductive filler such as graphite and the ordinate axis represents calculated wear rate 54. In this embodiment, profile 56 represents wear rate for epoxy with nanotitania as a nanofiller. Further, profile 58 represents wear rate for epoxy having 5 volume percentage of graphite and 5 volume percentage of carbon nanofibers with nanotitania as the filler. Moreover, profile 60 represents wear rate for epoxy having 15 volume percentage of graphite and 15 volume percentage of carbon nanofibers with nanotitania as the filler.

As can be seen, incorporation of such nanofillers in the nanomaterial layer 32 facilitates reduction up to two orders of magnitude in the wear rate. Further, the composition of the nanomaterial layer 32 may be tailored to achieve a desired wear resistance. The nanofillers such as graphite, carbon nanotubes and nanotitania may be incorporated into epoxy and other thermosetting resins and can be formulated as coatings using solvents. Such formulations are readily available in the market and are made using sol-gel techniques. Further, use of conductive fillers such as carbon nanotubes, carbon nanofillers and boron nitrides enhance the thermal conductivity of the nanomaterial layer 32 thereby facilitating heat dissipation from the die 24.

Figure 5:
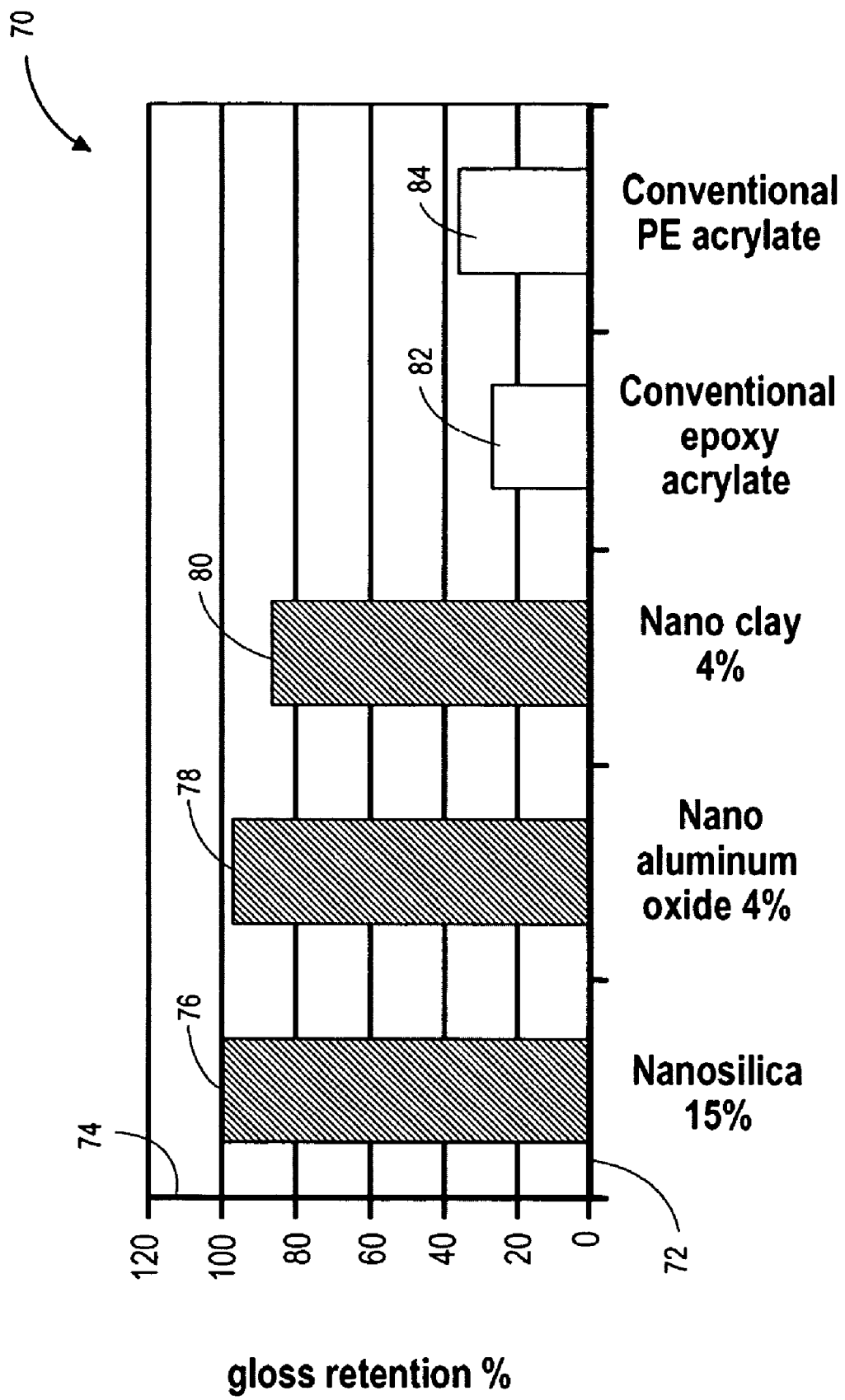
FIG. 5 illustrates exemplary results for gloss retention (%) for a variety of nanofillers in accordance with embodiments of present technique.

In certain embodiments, the nanomaterial layer 32 may be made transparent by customizing the composition of the nanomaterial layer 32. FIG. 5 illustrates exemplary results for gloss retention (%) for a variety of nanofillers. The abscissa axis 72 represents a plurality of nanofillers employed in the nanomaterial layer 32 along with their respective weight percentage. Further, the ordinate axis 74 represents the gloss retention for the respective nanofillers. In the illustrated embodiment, exemplary profiles 76, 78, 80, 82 and 84 represent gloss retention for a plurality of nanofillers such as nanosilica, nanoaluminium oxide, nanoclay and epoxy acrylate. As can be seen, such fillers may be employed to enhance the wear resistance and to facilitate a transparent appearance of the nanomaterial layer 32. Further, a weight percentage of such fillers may be adjusted to achieve a desired gloss retention of the nanomaterial layer 32.

Figure 6:
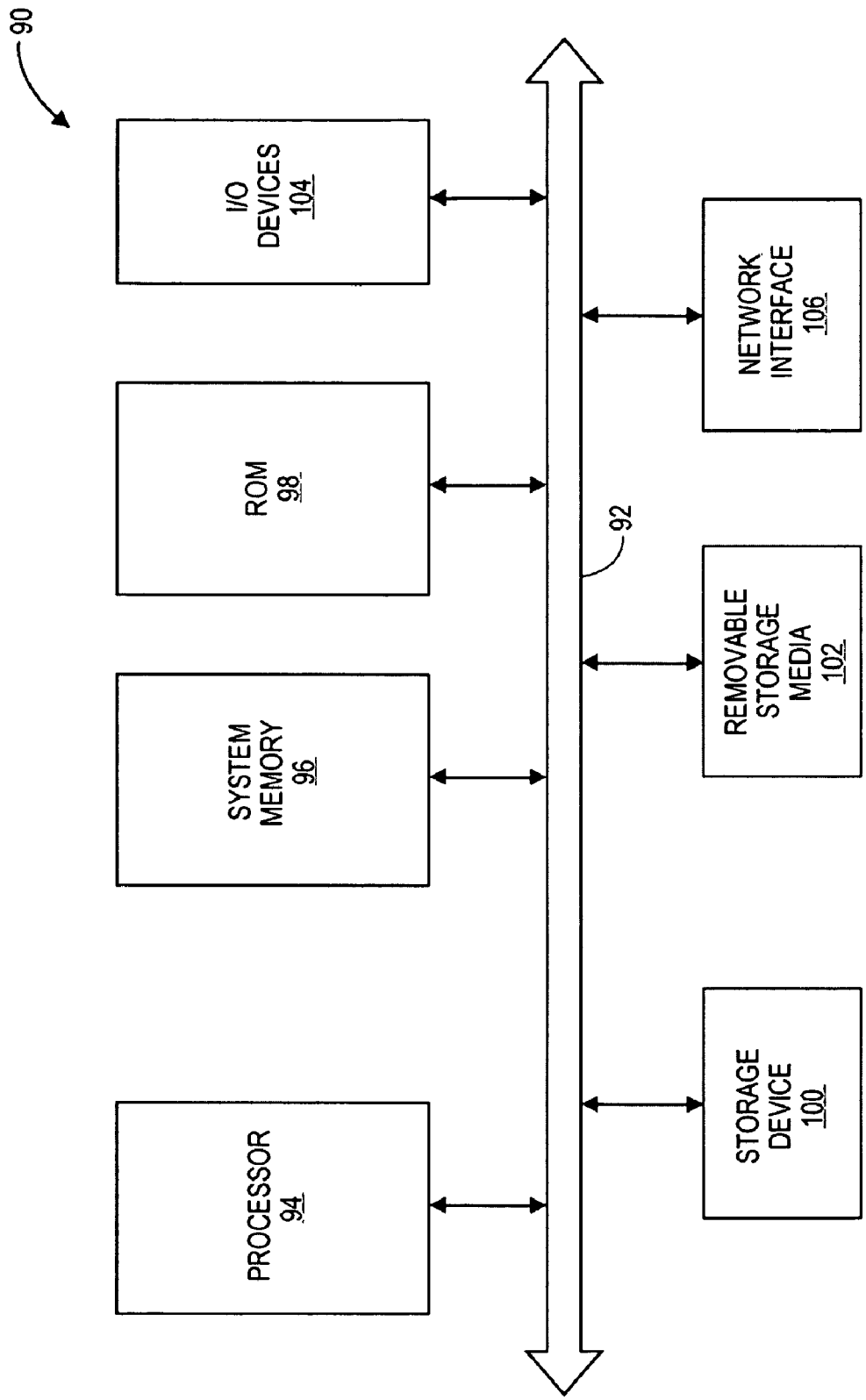
FIG. 6 illustrates an embodiment of a computer system.

The microelectronic package described above may be disposed in a computer system, a wireless communicator and a hand-held device. FIG. 6 illustrates an embodiment of a computer system 90. The computer system 90 includes a bus 92 to which the various components are coupled. In certain embodiments, the bus 92 includes a collection of a plurality of buses such as a system bus, a Peripheral Component Interface (PCI) bus, a Small Computer System Interface (SCSI) bus, etc. Representation of these buses as a single bus 92 is provided for ease of illustration, and it should be understood that the system 90 is not so limited. Those of ordinary skill in the art will appreciate that the computer system 90 may have any suitable bus architecture and may include any number of combination of buses.

A processor 94 is coupled to the bus 92. The processor 94 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 6 shows a single processor 94, the computer system 90 may include two or more processors.

The computer system 90 further includes system memory 96 coupled to the bus 92. The system memory 96 may include any suitable type and number of memories, such as static random access memory (SRAM), dynamic random access memory (DRAM), synchronous dynamic random access memory (SDRAM), or double data rate DRAM (DDRDRAM). During operation of the computer system 90, an operating system and other applications may be resident in the system memory 96.

The computer system 90 may further include a read-only memory (ROM) 98 coupled to the bus 92. The ROM 98 may store instructions for the processor 94. The computer system 90 may also include a storage device (or devices) 100 coupled to the bus 92. The storage device 100 includes any suitable non-volatile memory, such as, for example, a hard disk drive. The operating system and other programs may be stored in the storage device 100. Further, a device 102 for accessing removable storage media (e.g., a floppy disk drive or a CD ROM drive) may be coupled to the bus 92.

The computer system 90 may also include one or more Input/Output (I/O) devices 104 coupled to the bus 92. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 90.

The computer system 90 may further comprise a network interface 106 coupled to the bus 92. The network interface 106 comprises any suitable hardware, software, or combination of hardware and software that is capable of coupling the system 90 with a network (e.g., a network interface card). The network interface 106 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (HyperText Transmission Protocol, as well as others.

It should be understood that the computer system 90 illustrated in FIG. 6 is intended to represent an embodiment of such a system and, further, that this system may include any additional components, which have been omitted for clarity and ease of understanding. By way of example, the system 90 may include a direct memory access (DMA) controller, a chip set associated with the processor 94, additional memory (e.g., cache memory) as well as additional signal lines and buses. Also, it should be understood that the computer system 90 may not include all the components shown in FIG. 6. The computer system 90 may comprise any type of computing device, such as a desktop computer, a laptop computer, a server, a hand-held computing device, a wireless communication device, an entertainment system etc.

In this embodiment, the computer system 90 may include the device as described in the embodiments above. By way of example, the processor 90 may include a semiconductor substrate and a die having a top surface and a bottom surface. The bottom surface of the die is coupled to the semiconductor substrate. Further, a nanomaterial layer may be disposed on the top surface of the die. The nanomaterial layer includes a scratch and abrasion resistance material.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A microelectronic package, comprising:
a semiconductor substrate;
a die having a top surface and a bottom surface, wherein the bottom surface of the die is coupled to the semiconductor substrate; and
a nanomaterial layer disposed on the top surface of the die, wherein the nanomaterial layer comprises a resin having a nanofiller disposed within the resin, wherein the nanomaterial layer comprises a scratch and abrasion resistant material, and wherein a weight percentage of the nanofiller in the nanomaterial layer is between about 1% to about 60%.

2. The microelectronic package of claim 1, wherein the nanomaterial is to facilitate heat dissipation from the die to a surrounding environment.

3. The microelectronic package of claim 1, wherein the resin comprises epoxy, or acrylate, or polycarbonate, or polyimide, or polyolefins, or combinations thereof.

4. The microelectronic package of claim 1, wherein the nanofiller comprises carbon, or graphite, or carbon nanotubes, or carbon nanofibers, or boron nitride nanotubes, or alumina, or silica, or titania, or zirconia, or aluminum nitride, or diamond, or combinations thereof.

5. The microelectronic package of claim 1, wherein a shape of the nanofiller is a sphere, or a rod, or a tube, or a platelet, or combinations thereof.

6. The microelectronic package of claim 1, wherein the nanofiller is to facilitate a transparent appearance of the nanomaterial layer.

7. The microelectronic package of claim 1, wherein a thickness of the nanomaterial layer is between about 1 micron to about 50 microns.

8. An article, comprising:
a die having a top surface and a bottom surface;
a nanomaterial layer disposed on the top surface of the die, wherein the nanomaterial layer has a thickness between 1 micron and 50 microns, and wherein the nanomaterial layer includes:
a resin;
a nanofiller disposed within the resin;
wherein the nanofiller disposed within the resin is between 1% and 60% by weight; and
wherein the nanofiller has a shape selected from a sphere, or a rod, or a tube, or a platelet, or combinations thereof.

9. The article of claim 8, wherein the nanofiller includes 2% by weight nanoalumina filler.

10. The article of claim 8, wherein the nanofiller includes 10% by weight nanoalumina filler.

11. The article of claim 8, wherein the nanomaterial layer includes epoxy with 5% by volume conductive filler and 5% nanotitania.

12. The article of claim 8, wherein the nanomaterial layer includes epoxy with 15% by volume conductive filler and 15% nanotitania.

13. The article of claim 8, wherein the nanomaterial layer exhibits a gloss retention between 83% and 100%.

14. An article, comprising:
a die having a top surface and a bottom surface;
a nanomaterial layer disposed on the top surface of the die, wherein the nanomaterial layer has a thickness between 1 micron and 50 microns, and wherein the nanomaterial layer includes:
a resin;
a nanofiller disposed within the resin;
wherein the nanofiller disposed within the resin is between 1% and 60% by weight; and
wherein the nanomaterial layer exhibits a gloss retention between 83% and 100%.

15. The article of claim 14,
wherein the resin comprises epoxy, or acrylate, or polycarbonate, or polyimide, or polyolefins, or combinations thereof,
wherein the nanofiller comprises carbon, or graphite, or carbon nanotubes, or carbon nanofibers, or boron nitride nanotubes, or alumina, or silica, or titania, or zirconia, or aluminum nitride, or diamond, or combinations thereof, and
wherein the nanofiller has a shape selected from a sphere, or a rod, or a tube, or a platelet, or combinations thereof.

16. The article of claim 14, wherein the nanofiller includes one of 2% by weight nanoalumina filler and 10% by weight nanoalumina filler.

17. The article of claim 14, wherein the nanomaterial layer includes epoxy with one of 15% by weight nanosilica filler, 4% by weight nanoalumina filler, and 4% by weight nanoclay filler.

* * * * *